(12) United States Patent
Muddu et al.

(10) Patent No.: US 8,589,844 B2
(45) Date of Patent: Nov. 19, 2013

(54) METHODS FOR ANALYZING DESIGN RULES

(75) Inventors: Swamy Muddu, Milpitas, CA (US); Abde Ali Kagalwalla, Los Angeles, CA (US); Luigi Capodieci, Santa Cruz, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/369,938

(22) Filed: Feb. 9, 2012

(65) Prior Publication Data

US 2013/0212548 A1     Aug. 15, 2013

(51) Int. Cl.
*G06F 17/50*       (2006.01)
*G06F 9/455*       (2006.01)

(52) U.S. Cl.
USPC .......................... 716/111; 716/110; 716/112

(58) Field of Classification Search
USPC ................................. 716/110–112
See application file for complete search history.

(56) References Cited

U.S. PATENT DOCUMENTS

| 2005/0188338 | A1* | 8/2005 | Kroyan et al. | 716/9 |
| 2005/0251771 | A1* | 11/2005 | Robles | 716/5 |
| 2009/0144686 | A1* | 6/2009 | Lensing et al. | 716/10 |
| 2010/0242000 | A1* | 9/2010 | Strenski et al. | 716/4 |

\* cited by examiner

*Primary Examiner* — Suresh Memula
(74) *Attorney, Agent, or Firm* — Ingrassia Fisher & Lorenz, P.C.

(57) ABSTRACT

Methods and apparatus are provided for analyzing impact of design rules on a layout. One exemplary method involves generating variants of the layout for different values for the rule, determining values of a device metric for each of the layout variants, and identifying the relationship between rule and the device metric based on the values for the device metric corresponding to the different values for the rule. In one embodiment, the layout variants are generated by using the different values for the rule to perform layout compaction on an initial layout generated in accordance with an initial value for the rule.

19 Claims, 3 Drawing Sheets

METHODS FOR ANALYZING DESIGN RULES

TECHNICAL FIELD

Embodiments of the subject matter described herein generally relate to semiconductor device structures and related design and fabrication methods, and more particularly, embodiments of the subject matter relate to methods for analyzing the impact of design rules on a layout.

BACKGROUND

Modern electronic circuits are often designed and subsequently manufactured using software tools, commonly referred to as electronic design automation (EDA) tools. For example, a circuit designer will define the intended functionality of the circuit (e.g., using a hardware description language), and the EDA tools translate the intended functionality to a layout of logic gates and/or hardware components that achieve the intended functionality. When generating the layout, the EDA tools account for design rules provided by a foundry or semiconductor manufacturer that the circuit designer has chosen to fabricate the circuit. The design rules may specify various restrictions or limitations on feature geometry, spacing, and the like, for the various layers of the circuit that account for fabrication process variations for the particular technology node that the circuit is to be fabricated in. By ensuring that the layout satisfies the design rules provided by the foundry, the circuit designer is assured that the circuit can be fabricated in the desired technology node with a sufficient yield.

In some situations, a circuit designer may desire that one or more of the design rules provided by the foundry be relaxed to achieve desired performance targets or other objectives. However, in practice, the number and complexity of the design rules increases at smaller technology nodes. Thus, it is increasingly difficult for circuit designers to assess the impact of individual design rules on a layout and identify how relaxing particular design rules would affect the performance and/or yield of the fabricated device. Accordingly, it is desirable to provide a means for analyzing the impact of design rules on a layout.

BRIEF SUMMARY

In exemplary embodiments, methods are provided for analyzing impact of one or more design rules on a layout. One exemplary method involves generating a variant of the layout for each of a plurality of different values for the rule, determining, for each of the layout variants, a value for a device metric, and identifying a relationship between the rule and the device metric based on the plurality of device metric values.

In another embodiment, a method for analyzing impact of a rule of a design rule set on a device layout involves modifying values of the rule to obtain a plurality of modified design rule sets, generating variants of the device layout for each of the plurality of modified design rule sets, determining values for a device metric for each of the plurality of layout variants, and graphically indicating a relationship between the rule and the device metric based on the plurality of device metric values.

In yet another embodiment, an apparatus for a computer-readable medium having computer-executable instructions or data stored thereon executable by a computing device is provided. When executed by the computing device, the computer-executable instructions are configured to cause the computing device to modify values of a rule of a rule set to obtain a plurality of modified rule sets, obtain a plurality of layout variants generated based on the plurality of modified rule sets, obtain a plurality of values for a device metric based on the plurality of layout variants, and graphically indicate, on a display device, the relationship between the rule and the device metric based on the plurality of values for the device metric.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Embodiments of the subject matter described herein relate to analyzing the impact of design rules on a device layout. In exemplary embodiments, for an initial device (or circuit) layout that is compliant with an initial design rule set, a relevant subset of design rules of that design rule set which are most likely to influence the layout are identified, and the rule values for those identified design rules are varied across a range of values to obtain a plurality of modified design rule sets. For each modified design rule set, a variant of the initial layout is generated by performing layout compaction using the rule values of that respective modified design rule set. After generating layout variants corresponding to the modified design rule sets, values for one or more device metrics are calculated or otherwise determined for each respective layout variant. As used herein, a device metric should be understood as referring to a value that quantifies or otherwise represents a characteristic of a device layout. As described in greater detail below, the values for the one or more device metrics for a plurality of layout variants are correlated to the values of the design rules of the modified design rule set corresponding to the individual layout variants. For example, an equation representative of the area of a layout as a function of a particular design rule (e.g., a minimum spacing or the like) may be determined based on the relationship of the area of different layout variants with respect to the various rule values for that particular design rule. The relationship or correlation between a particular design rule and a particular device metric is graphically indicated to a circuit designer, for example, by displaying the equation representative of that device metric as a function of that design rule (or a graphical or tabular representation thereof). Additionally, if an optimal value for a particular design rule exists (e.g., a rule value that minimizes or maximizes a particular device metric), the optimal value for that design rule may also be identified and displayed or otherwise indicated. In this manner, a circuit designer may readily ascertain the impact of various design rules of the design rule set on a given layout, and determine how rule values of one or more design rules of the design rule set could be modified to produce corresponding changes to the device layout and achieve desired performance characteristics.

Figure 1:
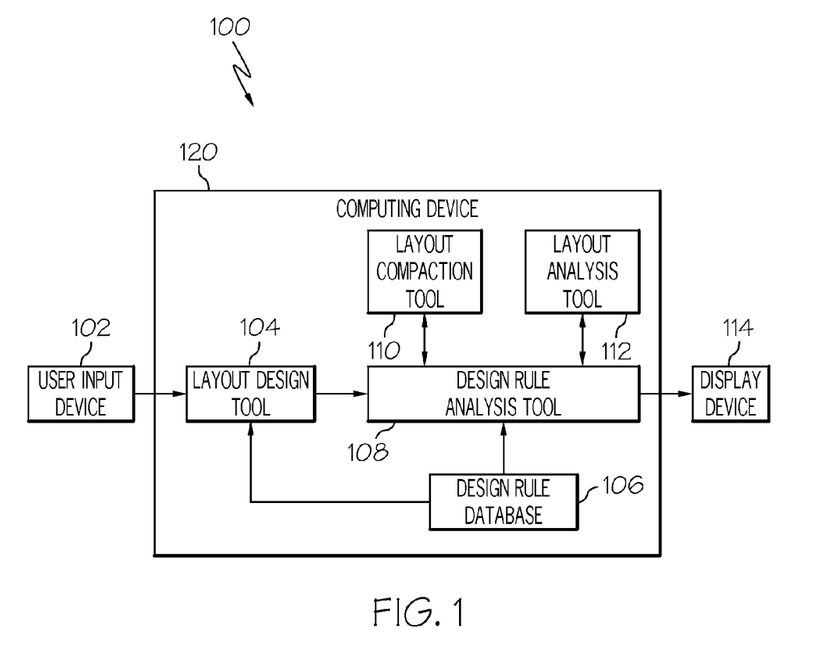
FIG. 1 is a block diagram of an electronic device design system in an exemplary embodiment.

FIG. 1 depicts an exemplary embodiment of an electronic device design system 100 suitable for analyzing the impact of one or more design rules of a design rule set on a device layout, as described in greater detail below in the context of FIG. 2. The illustrated embodiment of electronic device design system 100 includes, without limitation, a user input device 102, a layout design tool 104, a design rule database 106, a design rule analysis tool 108, a layout compaction tool 110, a layout analysis tool 112, and a display device 114. In an exemplary embodiment, the layout design tool 104, the design rule analysis tool 108, the layout compaction tool 110, and the layout analysis tool 112 are each realized as a software module (or EDA tool) executed or otherwise implemented by a computing device 120 (e.g., a computer, a processor, or the like) to perform their respective tasks, functions, and/or operations described herein. In this regard, the functionality of the layout design tool 104, the design rule analysis tool 108, the layout compaction tool 110, and/or the layout analysis tool 112 can be stored on, encoded on, or otherwise embodied by any suitable non-transitory computer readable medium (e.g., a removable disk, a CD-ROM, a digital versatile disk (DVD), flash memory, a hard disk, registers, RAM memory, ROM memory, a magnetic storage device, etc.) as computer-executable instructions or data stored thereon that, when executed by the computing device 120, cause the computing device 120 to perform the tasks, functions, and/or operations described herein. It should be noted that although FIG. 1 depicts the layout design tool 104, the design rule analysis tool 108, the layout compaction tool 110, and the layout analysis tool 112 as separate elements, in some embodiments, the layout design tool 104, the design rule analysis tool 108, the layout compaction tool 110, and the layout analysis tool 112 may be integrated into a single software module executable by the computing device 120.

In the illustrated embodiment of FIG. 1, the computing device 120 generally represents the hardware and/or firmware components configured to implement or otherwise execute the layout design tool 104, the design rule analysis tool 108, the layout compaction tool 110, and the layout analysis tool 112 to support operation of the electronic device design system 100 in conjunction with the design rule analysis process described in greater detail below in the context of FIG. 2. In exemplary embodiments, the computing device 120 includes a processor or other processing logic configured to carry out the functions, techniques, and processing tasks described herein. In an exemplary embodiment, the display device 114 is realized as an electronic display that is communicatively coupled to the computing device 120 and configured to graphically display or otherwise indicate the relationships between one or more design rules of a design rule set maintained by the design rule database 106 and one or more device metrics, as described in greater detail below.

The user input device 102 is coupled to the computing device 120 and generally represents the physical component of the electronic device design system 100 configured to allow a user, such as a circuit designer, to interact with the layout design tool 104 and/or other elements of the electronic device design system 100 in a conventional manner. Depending on the embodiment, the user input device 102 may be realized as a keyboard, mouse, touchpad, touch panel (or touchscreen), or another suitable device adapted to receive input from a user. The design rule database 106 generally represents a data storage element that maintains information regarding a design rule set provided by a foundry or other semiconductor fabrication entity for a particular fabrication technology (or technology node) that the circuit designer would like to utilize for fabricating devices. In this regard, the design rule database 106 maintains an association between design rules of the design rule set and their associated rule values provided by the foundry. The design rule database 106 may be physically realized using RAM memory, ROM memory, flash memory, registers, a hard disk, or another data storage medium known in the art or any combination thereof. It should be noted that in some embodiments, the design rule database 106 may be realized as a portable data storage element that is external to or otherwise separate from the computing device 120, such as, for example, a portable hard drive, a USB flash drive, an optical disc, or the like.

In an exemplary embodiment, the layout design tool 104 generally represents the software module(s) executed or otherwise implemented by the computing device 120 that is configured to support high-level functional circuit design (e.g., by supporting a suitable hardware description language, such as Verilog, VHDL, or the like), convert the intended high-level functional circuit design into a netlist that describes the instances of logic gates and/or other hardware components and corresponding interconnections needed to implement the intended functionality for the circuit, select standard cells from a standard cell library for implementing the logic gates and/or hardware components specified by the design netlist, and optimally place and route the selected standard cells to produce a device (or circuit) layout corresponding to a manufacturable hardware implementation of the high-level functionality. In this regard, a circuit designer or other user utilizes or otherwise operates the user input device 102 to interact with the layout design tool 104 to describe or otherwise define the intended functionality of a device or circuit to be created, wherein the layout design tool 104 generates a device layout corresponding to the hardware implementation of the high-level circuit functionality provided by the user. In an exemplary embodiment, one or more components of the layout design tool 104 accounts for the design rules for the particular fabrication technology (or technology node), so that the generated device layout is substantially compliant with the design rule set maintained by the design rule database 106. For example, the layout design tool 104 may include a routing tool and/or router technology file that accesses the design rule database 106 to obtain rule values for the various design rules of the design rule set provided by the foundry and utilizes those rule values when executing algorithms to interconnect and/or route between placed standard cells without violating the design rules. Similarly, the standard cells of the standard cell library may have dimensions or other geometric characteristics (e.g., heights, widths, pitches, spacings, and the like) that are compliant with the rule values of the design rules of the design rule set to ensure they are capable of being fabricated by the foundry in the desired technology node. In practice, the layout design tool 104 may generate the device layout as a layout data file, such as a Graphical Database System II (or GDSII) format layout data file, that is representative of the placed and routed circuit described by the design netlist based on the intended circuit functionality. It should be noted that although the subject matter may be described herein in the context of the device layout generated by the layout design tool 104 being compliant with the design rule set maintained by the design rule database 106, in some embodiments, the device layout may violate one or more of the design rules as desired by the circuit designer. For example, the layout design tool 104 may implement or otherwise perform design rule checking and allow the circuit designer to manually determine whether to correct all of the design rule violations identified by the layout design tool 104. Thus, the device layout generated by the layout design tool 104 and provided to the design rule analysis tool 108 need not be perfectly compliant with the design rule set maintained by the design rule database 106.

Figure 2:
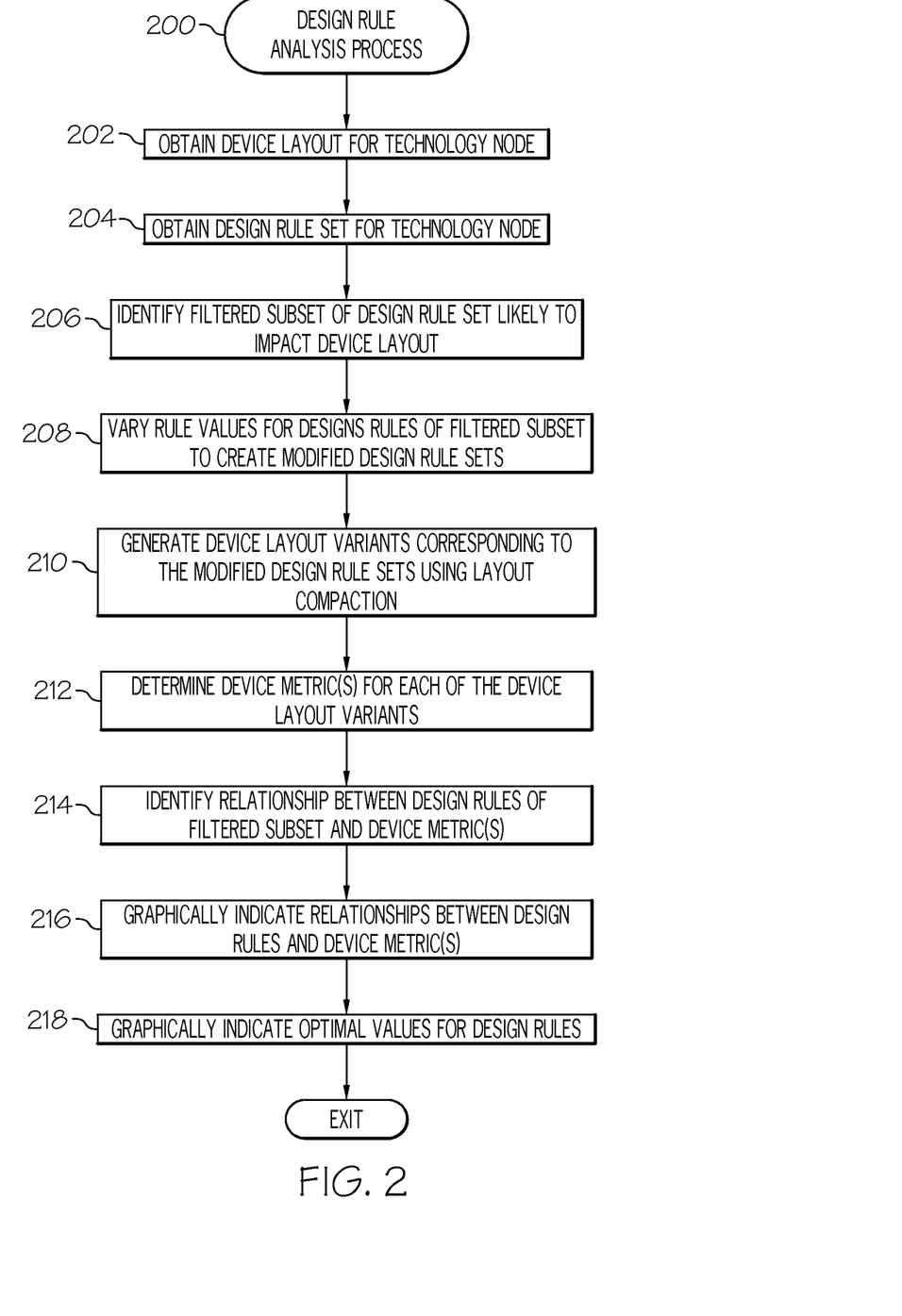
FIG. 2 is a flow diagram of an exemplary design rule analysis process suitable for use with the electronic device design system of FIG. 1 in an exemplary embodiment.

In the illustrated embodiment, the design rule analysis tool 108 generally represents the software module executed or otherwise implemented by the computing device 120 that is configured to obtain the device layout (e.g., the completed layout data file) from the layout design tool 104, obtain the rule values for the design rules of the design rule set from the design rule database 106, and utilize the layout compaction tool 110 to generate a plurality of device layout variants by modifying and/or varying the rule values for one or more design rules of the design rule set, as described in greater detail below in the context of the design rule analysis process of FIG. 2. The layout compaction tool 110 generally represents the software module executed or otherwise implemented by the computing device 120 that is configured to receive an input device layout and an input design rule set and generate a variant of the input device layout by modifying the input device layout (e.g., by increasing and/or decreasing dimensions of features, increasing and/or decreasing spacing between features, and the like) to comply with the input design rule set. In this regard, based on the input design rule set, the layout compaction tool 110 performs one or more layout compaction algorithms to adjust or otherwise modify feature dimensions, shapes, spacings, and the like of the input device layout to comply with the rule values of the input design rule set. The layout analysis tool 112 generally represents the software module executed or otherwise implemented by the computing device 120 that is configured to receive an input device layout from the design rule analysis tool 108 and, based on the input device layout, perform one or more algorithms to calculate or otherwise determine values for one or more device metrics for that input device layout. Depending on the embodiment, the device metrics may be area, performance, dynamic power, leakage power, and/or fabrication metrics, such as lithography hotspots (i.e., feature shorts or opens), feature critical dimension (CD) and yield.

FIG. 2 depicts an exemplary design rule analysis process 200 suitable for implementation by a electronic device design system 100 to analyze or otherwise assess the impact of one or more design rules of a design rule set on a device layout. The various tasks performed in connection with the design rule analysis process 200 may be performed by software, hardware, firmware, or any combination thereof. For illustrative purposes, the following description refers to elements mentioned above in connection with FIG. 1. In practice, portions of the design rule analysis process 200 may be performed by different elements of the electronic device design system 100, such as, for example, the layout design tool 104, design rule database 106, design rule analysis tool 108, layout compaction tool 110, layout analysis tool 112, the display device 114 and/or the computing device 120. It should be appreciated that the design rule analysis process 200 may include any number of additional or alternative tasks, the tasks need not be performed in the illustrated order and/or the tasks may be performed concurrently, and/or the design rule analysis process 200 may be incorporated into a more comprehensive procedure or process having additional functionality not described in detail herein. Moreover, one or more of the tasks shown and described in the context of FIG. 2 could be omitted from a practical embodiment of the design rule analysis process 200 as long as the intended overall functionality remains intact.

Referring to FIG. 2, and with continued reference to FIG. 1, in an exemplary embodiment, the design rule analysis process 200 begins by obtaining a device (or circuit) layout and a design rule set for the particular technology node that the device layout is to be implemented in (tasks 202, 204). In this regard, the design rule analysis tool 108 obtains, from the layout design tool 104, the device layout generated by the layout design tool 104 that is substantially compliant with the design rule set maintained by the design rule database 106 after a circuit designer manipulates the layout design tool 104 to generate or otherwise create a layout of logic gates and/or hardware elements that provide the intended functionality. The design rule analysis tool 108 also obtains, from the design rule database 106, the set of design rules and their associated rule values for the particular technology node that the device layout is to be implemented in. Thus, the design rules (and associated rule values) obtained by the design rule analysis tool 108 from the design rule database 106 are the same as those utilized by the layout design tool 104 when generating the device layout provided to the design rule analysis tool 108.

In an exemplary embodiment, the design rule analysis process 200 continues by identifying a filtered subset of the design rules that are likely to impact the device layout and varying the rule values across those design rules to create or otherwise generate a plurality of modified design rule sets (tasks 206, 208). In this regard, the rule values for design rules of the original design rule set that are identified as being unlikely to impact the device layout (e.g., design rules that are not part of the filtered subset) may have rule values in the modified design rule sets that are the same as their original rule values maintained by the design rule database 106. For each respective modified design rule set, one or more of the design rules identified as being likely to impact the device layout (e.g., design rules that are part of the filtered subset) have rule values that are different from their original rule values maintained by the design rule database 106, as described in greater detail below.

In an exemplary embodiment, to identify the filtered subset of design rules, the design rule analysis tool 108 initially excludes or otherwise removes design rules pertaining to layers and/or features that are not relevant to the device layout. For example, when the device layout does not utilize a particular layer (e.g., Metal 2), the design rule analysis tool 108 excludes or otherwise removes design rules pertaining to that layer from further consideration and maintains the rule values for those design rules at the same value as originally provided by the design rule database 106. In an exemplary embodiment, after excluding irrelevant design rules, the design rule analysis tool 108 continues by determining which of the remaining design rules are most likely to impact the device layout by estimating the impact of relatively low and/or relatively high rule values for each of the remaining rules on the device layout and excluding or otherwise removing those design rules that have a relatively lesser impact as compared to other of the remaining design rules. In this regard, the filtered subset of the design rules includes those design rules that are likely to have a relatively greater and/or non-negligible impact on the device layout while design rules having a relatively lesser and/or negligible impact on the device layout are excluded from the filtered subset.

For example, in one embodiment, for each of the remaining design rules, the design rule analysis tool 108 calculates or otherwise estimates how a characteristic of the device layout would be affected if the rule value for that particular design rule were a relatively high and/or relatively low value relative to its original rule value (e.g., by increasing and/or decreasing the rule value by a particular percentage of the original rule value), and selects or otherwise includes design rules having a relatively greater impact on that characteristic of the device layout in the filtered subset while excluding design rules having a relatively lesser impact and maintaining the rule values for those excluded design rules at the same value as originally provided by the design rule database 106. For example, if a design rule for a minimum spacing has an original rule value of 50 nanometer (nm), the design rule analysis tool 108 may calculate or otherwise estimate how the area (or another metric) of the device layout would be changed if the minimum spacing was decreased to fifty percent of its original value (e.g., 25 nm) or increased to two hundred percent of its original value (e.g., 100 nm). If the estimated area of the device layout would change by more than a threshold amount relative to the original area of the device layout (e.g., increase and/or decrease by more than a non-negligible percentage of the original area of the device layout), the design rule analysis tool 108 selects or otherwise includes that design rule in the filtered subset of design rules, and conversely, if the estimated area of the device layout would change by less than the threshold amount, the design rule analysis tool 108 excludes or otherwise removes that design rule from the filtered subset of design rules. In other embodiments, the design rule analysis tool 108 may select, for inclusion in the filtered subset, the number or percentage of the remaining design rules producing the greatest change in the characteristic of the device layout. For example, the design rule analysis tool 108 may select the ten design rules that are estimated to produce the ten greatest estimated changes in the area of the device layout as the filtered subset of design rules.

As described above, after identifying the filtered subset of design rules that are most likely to impact the device layout, the design rule analysis tool 108 generates or otherwise creates a plurality of modified design rule sets by varying or otherwise modifying the rule values of those design rules while maintaining the rule values of the other design rules constant and equal to their original values provided by the foundry. Thus, in an exemplary embodiment, for each respective modified design rule set, the rule value for one of the design rules of the filtered subset is different from the original rule value maintained by the design rule database 106 for that design rule. For example, for each design rule of the filtered subset, the design rule analysis tool 108 may increment the rule value from a lower boundary value (e.g., ninety percent of the original rule value obtained from the design rule database 106) to an upper boundary value (e.g., hundred and ten percent of the original rule value) and create a modified design rule set corresponding to each incremental rule value for that design rule, with the remaining design rules of the modified design rule sets having rule values equal to their original rule values obtained from the design rule database 106. In this manner, the design rule analysis tool 108 modifies or otherwise adjusts the rule value for each design rule of the filtered subset to obtain the modified design rule sets.

Still referring to FIG. 2, in an exemplary embodiment, the design rule analysis process 200 continues by generating or otherwise creating variants of the device layout for each modified design rule set (task 210). In this regard, the design rule analysis process 200 generates, for each modified design rule set, a device layout variant based on the original device layout obtained from the layout design tool 104 that is compliant with the rule values of that respective modified design rule set. Thus, any differences between a device layout variant and the original device layout are attributable to the rule value of the particular design rule that was modified to obtain the modified design rule set associated with that particular device layout variant. In an exemplary embodiment, the device layout variants are generated by compacting the original device layout in accordance with the rule values for each modified design rule set to obtain device layout variants, wherein each device layout variant satisfies or otherwise complies with the rule values of its associated modified design rule set. In this regard, for each modified design rule set, the design rule analysis tool 108 provides the original device layout obtained from the layout design tool 104 to the layout compaction tool 110 for use as an input device layout along with the rule values corresponding to that modified design rule set to the layout compaction tool 110 for use as the input design rule set. Based on the input design rule set, the layout compaction tool 110 performs one or more layout compaction algorithms to adjust or otherwise modify feature dimensions, shapes, spacings, and the like of the original device layout to comply with or otherwise satisfy the rule values of the modified design rule set. Thus, the layout compaction tool 110 produces a variant of the original device layout obtained from the layout design tool 104 that is compliant with the modified design rule set provided by the design rule analysis tool 108. The design rule analysis tool 108 obtains the device layout variant output by the layout compaction tool 110 and maintains an association between the device layout variant and its corresponding modified design rule set used to generate the device layout variant.

In an exemplary embodiment, after generating layout variants for each of the modified design rule sets, the design rule analysis process 200 continues by determining one or more device metrics for each of the layout variants, determining or otherwise identifying any correlations or other the relationships between the device metrics and the design rules of the filtered subset, and graphically indicating the relationships between the device metrics and the design rules (tasks 212, 214, 216). In an exemplary embodiment, the design rule analysis tool 108 provides each device layout variant obtained from the layout compaction tool 110 to the layout analysis tool 112, which, in turn, analyzes the device layout variant and calculates values of the device metrics for the device layout variant. For each device layout variant provided by the design rule analysis tool 108, the layout analysis tool 112 may calculate or otherwise estimate the area, performance, power consumption, yield, and/or another device metric based on that device layout variant. For example, the layout analysis tool 112 may generate contours corresponding to a device layout variant, perform lithography simulation, calculate the probability of unintended electrical and/or geometric connections (e.g., shorts or opens), and estimate the yield for that device layout variant based on the probability of deviation from drawn shapes or unintended electrical characteristics. In an exemplary embodiment, the layout analysis tool 112 provides the calculated device metrics to the design rule analysis tool 108, which maintains the association between a respective device layout variant and its corresponding device metric(s) and modified design rule set.

After the desired performance and/or fabrication metrics are determined for the various device layout variants, in exemplary embodiments, the design rule analysis tool 108 determines or otherwise identifies the relationships between those device metrics and the design rules of the filtered subset. For example, the design rule analysis tool 108 may analyze the values for the device metrics and the rule values for the various design rules of the filtered subset (e.g., based on the rule values of the modified design rule sets associated with the device metric values) and determine or otherwise identify which device metrics are correlated with which design rules. In this manner, based on the rule values of the modified design rule sets associated with the values of the device metrics, the design rule analysis tool 108 quantifies or otherwise identifies the correlation between a device metric and a particular design rule. In accordance with one embodiment, for a particular design rule that the design rule analysis tool 108 identifies as being correlated with a particular device metric, the design rule analysis tool 108 determines an equation (or function) representative of the sensitivity of that particular device metric with respect to that particular design rule. In exemplary embodiments, for each design rule of the filtered subset, the design rule analysis tool 108 determines the correlation between the rule values of that design rule and the values for a device metric corresponding to those rule values and creates an equation representative of that device metric as a function of the rule value for that design rule (e.g., by performing regression analysis using the calculated device metric values and their corresponding rule values). For example, if a minimum metal-to-metal spacing for a particular layer is varied to create a plurality of modified design rule sets, the design rule analysis tool 108 may determine the correlation between the values for the metal-to-metal spacing and the area of the device layout variants corresponding to those metal-to-metal spacing values and create an equation representative of the device area as a function of the metal-to-metal spacing. In an exemplary embodiment, the design rule analysis tool 108 graphically indicates the relationships or correlations between the calculated device metrics and the design rules of the filtered subset on the display device 114. In this regard, the design rule analysis tool 108 may display the sensitivity functions (or graphical or tabular representations thereof) for the various device metrics with respect to the various design rules of the filtered subset. In some embodiments, the design rule analysis tool 108 may display a graph or plot based on the equation representative of a particular device metric as a function of the rule value for a particular design rule, such as, for example, a plot of the area of the device layout with respect to a minimum spacing criterion.

Referring again to FIG. 2, in accordance with one or more embodiments, the design rule analysis process 200 determines or otherwise identifies any optimal values for the design rules and graphically indicates those optimal values (task 218). In this regard, for a particular device metric, the design rule analysis tool 108 may identify a rule value for a particular design rule that maximizes and/or minimizes the value of that device metric or otherwise achieves a desired tradeoff between that device metric and another device metric. For example, the design rule analysis tool 108 may identify an optimal value for a minimum spacing criterion that achieves a desired tradeoff between minimizing device area and maximizing yield. In other embodiments, the design rule analysis tool 108 may analyze the equation representative of a device metric as a function of a design rule and identify an inflection point as an optimal rule value for the design rule.

After identifying an optimal value for a design rule, the design rule analysis tool 108 may display or otherwise graphically indicate the optimal value for that design rule on the display device 114. In some embodiments, the design rule analysis tool 108 may display or graphically indicate the optimal value for a design rule in conjunction with graphically indicating a correlation between that design rule and a device metric. For example, the design rule analysis tool 108 may display a plot of the area of the device layout with respect to a minimum spacing criterion, and on the plot, graphically indicate the optimal value for the minimum spacing criterion that achieves a desired tradeoff between the device area and another device metric (e.g., yield).

To briefly summarize, one advantage of the design rule analysis process 200 is that a circuit designer may readily identify how the rule values of one or more design rules of a design rule set could be modified to achieve desired device metric targets or a desired tradeoff between different device metrics. In this regard, the circuit designer may identify target rule values (which may or may not be the optimal values identified by the design rule analysis process 200) for one or more design rules of the filtered subset he or she would like to utilize to fabricate a semiconductor device or integrated circuit, and request the foundry accommodate the target rule values for those design rules. If the foundry can accommodate those target rule values, the circuit designer may then configure the layout design tool 104 to generate a layout for the semiconductor device or integrated circuit to be fabricated using those identified target rule values (with the remaining design rules of the design rule set having the values provided by the foundry). The resulting layout generated by the layout design tool 104 may be encoded in a suitable file format (e.g., GDSII format) on a computer-readable medium that may be subsequently provided to the foundry or a mask shop to translate the completed layout into a mask set (or photomasks) that may then be used to fabricate the semiconductor device or integrated circuit that achieves the high-level functionality provided by the circuit designer to the layout design tool 104.

Figure 3:
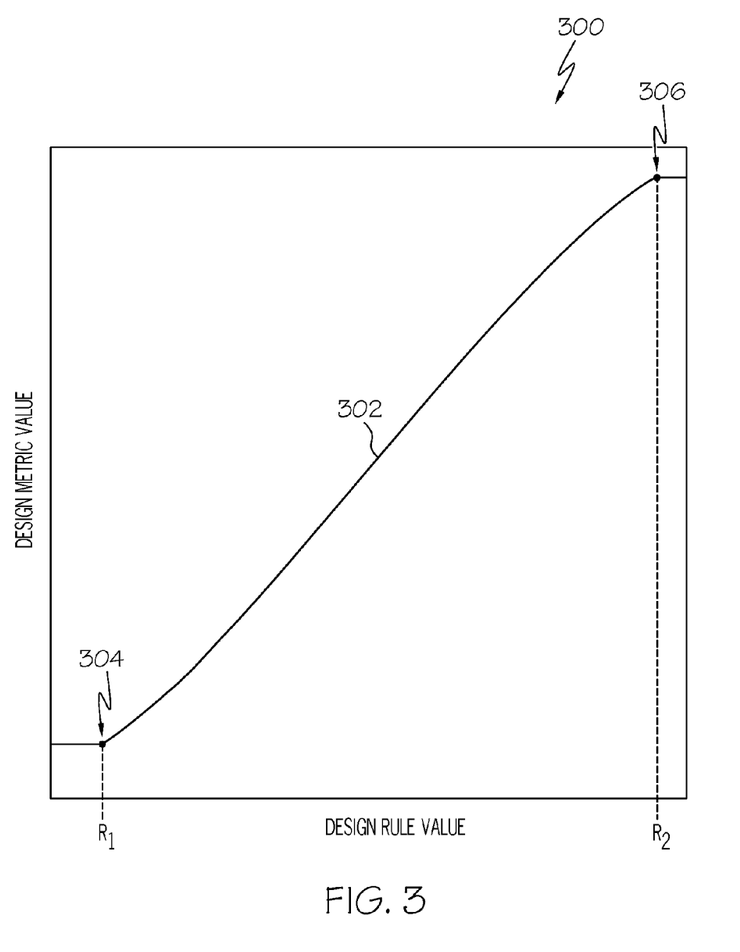
FIG. 3 depicts an exemplary design rule correlation display that may be presented by the electronic device design system of FIG. 1 in accordance with one exemplary embodiment of the design rule analysis process of FIG. 2.

FIG. 3 depicts an exemplary design rule correlation display 300 that may be presented by the computing device 120 on the display device 114 in conjunction with the design rule analysis process 200 described above. The design rule correlation display 300 includes a curve 302 that illustrates the relationship between the design rule values (or different design rule sets) and the resultant value calculated for a particular device metric. As described above, the design rule analysis tool 108 may identify a first rule value or design rule set (e.g., $R_1$) that minimizes the value of the device metric by identifying an inflection point 304 along the curve 302 at that rule value based on the value of the device metric remaining substantially constant for lower rule values. Similarly, the design rule analysis tool 108 may identify a second rule value or design rule set (e.g., $R_2$) that maximizes the value of the device metric by identifying a second inflection point 306 along the curve 302 at that rule value based on the value of the device metric remaining substantially constant for greater rule values. Thus, a circuit designer or foundry may readily identify that rule values above and/or below the identified rule values have a negligible impact on the design rule of interest (e.g., the design rule being varied). For example, if the rule value provided by the foundry is less than the lower rule value identified by the design rule analysis tool 108 (e.g., $R_1$) and the circuit designer would like to increase the device metric, the circuit designer can identify that he or she should request that the foundry accommodate a value for that design rule that is greater than the lower rule value, and at the same time, recognize that he or she need not request that the foundry accommodate a value greater than the upper rule value (e.g., $R_2$) identified by the design rule analysis tool 108. It should be appreciated that there are numerous different ways which the correlation between design rule values and/or design rule sets and device metrics can be displayed or otherwise presented to a user. In this regard, the design rule correlation display 300 merely represents one exemplary display in simplified form for purposes of explanation and FIG. 3 is not intended to limit the subject matter described herein in any way.

For the sake of brevity, conventional techniques related to integrated circuit design, EDA design flows, layout compaction, layout analysis, contour generation, lithography simulation, and other functional aspects of the systems (and the individual operating components of the systems) may not be described in detail herein. Physical embodiments of the subject matter described herein can be realized using existing semiconductor fabrication techniques and computer-implemented design tools. For example, embodiments of the subject matter described herein can be stored on, encoded on, or otherwise embodied by any suitable non-transitory computer-readable medium as computer-executable instructions or data stored thereon that, when executed by a computer, processor, of the like, facilitate design of electronic circuits and analysis of the completed layouts of the electronic circuits.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of analyzing impact of a rule on a layout, the method comprising:
   generating a variant of the layout for each of a plurality of values for the rule, resulting in a plurality of layout variants;
   determining, for each of the layout variants, a device metric value for a device metric, resulting in a plurality of device metric values;
   identifying a relationship between the rule and the device metric based on the plurality of device metric values; and
   graphically indicating, on a display device, the relationship between the rule and the device metric, wherein graphically indicating comprises defining a curve that defines the relationship between the plurality of values for the rule and the plurality of device metric values and that is displayed on the display device.

2. The method of claim 1, wherein generating the variant comprises: for each value of the plurality of values for the rule, compacting the layout in accordance with the respective value to obtain a respective layout variant of the plurality of layout variants.

3. The method of claim 2, wherein compacting the layout in accordance with the respective value comprises modifying the layout to comply with the respective value for the rule.

4. The method of claim 1, wherein determining the plurality of device metric values comprises calculating, for each of the plurality of layout variants, a value for a performance metric.

5. The method of claim 4, further comprising graphically indicating the relationship between values for the performance metric and the plurality of values for the rule on a display device.

6. The method of claim 1, wherein determining the plurality of device metric values comprises calculating, for each of the layout variants, a value for a fabrication metric.

7. The method of claim 6, further comprising graphically indicating the relationship between values for the fabrication metric and the plurality of values for the rule on a display device.

8. The method of claim 1, further comprising:
   determining an optimal value for the rule based on a relationship between the plurality of values for the rule and the plurality of device metric values; and
   graphically indicating the optimal value on a display device.

9. The method of claim 1, wherein identifying the relationship comprises determining a sensitivity function for the device metric as a function of the rule based on the plurality of values for the rule and the plurality of device metric values.

10. The method of claim 9, further comprising displaying the sensitivity function on a display device.

11. The method of claim 1, wherein identifying the relationship comprises:
    determining an equation representative of the device metric as a function of the rule based on the plurality of values for the rule and the plurality of device metric values; and
    displaying a plot of the equation on a display device.

12. The method of claim 1, further comprising:
    translating the layout into a mask set; and
    fabricating a semiconductor device utilizing the mask set.

13. A method of analyzing impact of a rule of a design rule set on a device layout, the method comprising:
    modifying a value of the rule to obtain a plurality of modified design rule sets;
    generating a variant of the device layout for each of the plurality of modified design rule sets, resulting in a plurality of layout variants;
    determining, for each of the plurality of layout variants, a device metric value for a device metric, resulting in a plurality of device metric values; and
    graphically indicating, on a display device, a relationship between the rule and the device metric based on the plurality of device metric values, wherein a curve defines the relationship and is displayed on the display device.

14. The method of claim 13, further comprising identifying the rule as being more likely to impact the device layout than other rules of the design rule set prior to modifying the value of the rule to obtain the plurality of modified design rule sets.

15. The method of claim 13, wherein generating the variant of the device layout for each of the plurality of modified design rule sets comprises performing layout compaction on the device layout based on a first modified design rule set of the plurality of modified design rule sets to obtain a first layout variant of the plurality of layout variants, the first layout variant being compliant with the first modified design rule set.

16. The method of claim 15, further comprising obtaining the device layout from a layout design tool configured to generate the device layout in accordance with the design rule set, wherein performing layout compaction comprises modifying the device layout to comply with the first modified design rule set.

17. A non-transitory computer-readable medium having computer-executable instructions or data stored thereon executable by a computing device to:
   modify a rule value for a rule of a rule set to obtain a plurality of modified rule sets;
   obtain a plurality of layout variants generated based on the plurality of modified rule sets;
   obtain a plurality of values for a device metric based on the plurality of layout variants; and
   graphically indicate, on a display device, a relationship between the rule and the device metric based on the plurality of values for the device metric, wherein a curve defines the relationship and is displayed on the display device.

18. The non-transitory computer-readable medium of claim 17, wherein the computer-executable instructions or data stored thereon cause the computing device to:
   determine a correlation between the plurality of values for the device metric and the rule values for the rule from the modified rule sets; and
   graphically indicate the relationship by displaying a graphical representation of the correlation on the display device.

19. The non-transitory computer-readable medium of claim 17, wherein the plurality of layout variants are generated by performing layout compaction on a device layout for the plurality of modified rule sets, resulting in each layout variant of the plurality of layout variants being compliant with the rule value for the rule provided by a respective modified rule set of the plurality of modified rule sets, the device layout being generated in accordance with the rule set.

* * * * *